United States Patent
Jang et al.

(10) Patent No.: US 6,765,406 B2
(45) Date of Patent: Jul. 20, 2004

(54) CIRCUIT BOARD CONFIGURED TO PROVIDE MULTIPLE INTERFACES

(75) Inventors: Ji Eun Jang, Kyoungki-do (KR); Jae Jin Lee, Kyoungki-do (KR)

(73) Assignee: Hynix Semiconductor Inc., Gyunggi-do (KR)

(*) Notice: Subject to any disclaimer, the term of this patent is extended or adjusted under 35 U.S.C. 154(b) by 20 days.

(21) Appl. No.: 10/330,821

(22) Filed: Dec. 27, 2002

(65) Prior Publication Data

US 2003/0122575 A1 Jul. 3, 2003

(30) Foreign Application Priority Data

Dec. 28, 2001 (KR) ........................................ 2001-86679

(51) Int. Cl.[7] .......................................... H03K 19/003
(52) U.S. Cl. ............................. 326/30; 326/21; 326/86; 326/90
(58) Field of Search .............................. 326/21, 30–34, 326/82, 86, 90

(56) References Cited

U.S. PATENT DOCUMENTS 5,706,447 A * 1/1998 Vivio ........................... 362/30
6,347,367 B1 * 2/2002 Dell et al. ................... 711/170

* cited by examiner

Primary Examiner—Anh Q. Tran
(74) Attorney, Agent, or Firm—Marshall, Gerstein & Borun LLP

(57) ABSTRACT

A circuit board configured to provide multiple interfaces is disclosed. The circuit board comprises a termination slot inserted with a termination module configured to modulate circuits by applying a termination resistance and a termination voltage. If the termination module is inserted into the termination slot, the circuit board operates as a series stub terminated transceiver logic (SSTL) interface. Otherwise, the board operates as a low voltage transistor logic (LVTTL) interface. Additionally, the board comprises a switch configured to selectively connect a termination resistance to a bus. If the switch connects the termination resistance to the bus, the board operates as an SSTL interface. Otherwise, the board operates as an LVTTL interface.

6 Claims, 4 Drawing Sheets

CIRCUIT BOARD CONFIGURED TO PROVIDE MULTIPLE INTERFACES

TECHNICAL FIELD

The present disclosure relates generally to circuit boards, and more particularly, to a circuit board configured to provide multiple interfaces.

BACKGROUND

FIG. 1 is a block diagram illustrating a conventional mother board using a low voltage transistor logic (LVTTL) interface. Typically, the mother board using an LVTTL interface comprises a bus 1 having one end connected to a chip set 2 and other end connected to a plurality of memory slots 3 inserted with DRAM modules 4. Here, the chip set 2 is a controller used in a board for LVTTL.

FIG. 2 is a block diagram illustrating a conventional mother board using a series stub terminated transceiver logic (SSTL) interface. The mother board using an SSTL interface comprises a bus 5 having both ends connected to the termination resistances 6. The termination voltages VTT are applied to the termination resistances 6. One end of the bus 5 is connected to a chip set 7, and the other end of the bus 5 is connected to a plurality of memory slots 8 inserted with DRAM modules 9. The chip set 7 is a controller used in a board for SSTL. Here, the termination resistances 6 used in the mother board prevent noise caused by echo to improve high operation. However, there is a problem because current consumption is increased during the operation.

In general, an LVTTL interface is used when SDRAM operates at relatively low speed while an SSTL interface is used when DDR SDRAM operates at relatively high speed. Typically, mother boards are used for SSTL interfaces but not for LVTTL interfaces because the termination resistances 6 are directly formed on the board. That is, if DDR SDRAM using an SSTL interface as DRAM module needs to use an LVTTL interface, the mother board of DDR SDRAM should be substituted with a mother board providing an LVTTL interface.

SUMMARY OF THE DISCLOSURE

A circuit board configured to provide multiple interfaces by selectively inserting a module formed of termination resistance into a slot is disclosed herein. Further, the board may be configured to provide multiple interfaces by selectively connecting termination resistance.

In particular, the board comprises: a bus configured to transmit data; a chip set connected to one end of the bus and configured to change setting of a memory driven system according to a logic; a plurality of memory slots connected to the other end of the bus, each memory slot configured to receive a memory module; and a plurality of termination slots correspondingly connected to each end of the bus, each termination slot configured to receive a termination module applying a termination voltage.

Alternatively, the board comprises: a bus configured to transmit data; an ordinary chip set connected to one end of the bus and configured to change for setting of a memory driven system according to a logic; a plurality of memory slots connected to other end of the bus, each memory slot configured to receive a memory module; a plurality of termination resistances correspondingly connected to each end of the bus, each termination resistance configured to apply a termination voltage; and a plurality of switching circuits connected between the bus and each termination resistance. Each of the plurality of switching circuits is configured to selectively connect the bus and each termination resistance according to the logic.

BRIEF DESCRIPTION OF THE DRAWINGS

The disclosure will be described in terms of several embodiments to illustrate its broad teachings. Reference is also made to the attached drawings.

DETAILED DESCRIPTION

Figure 1:
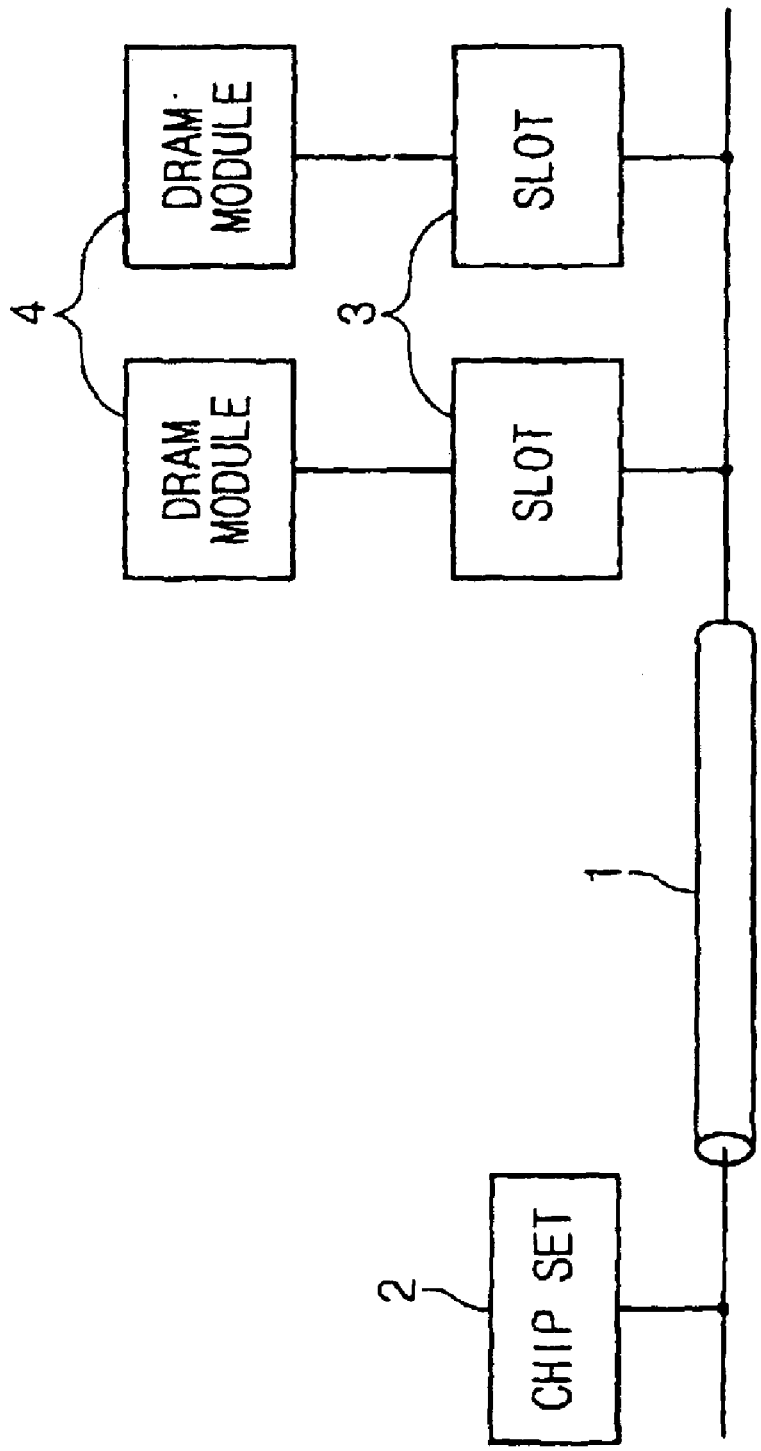
FIG. 1 is a block diagram illustrating a conventional mother board providing an LVTTL interface.
Figure 2:
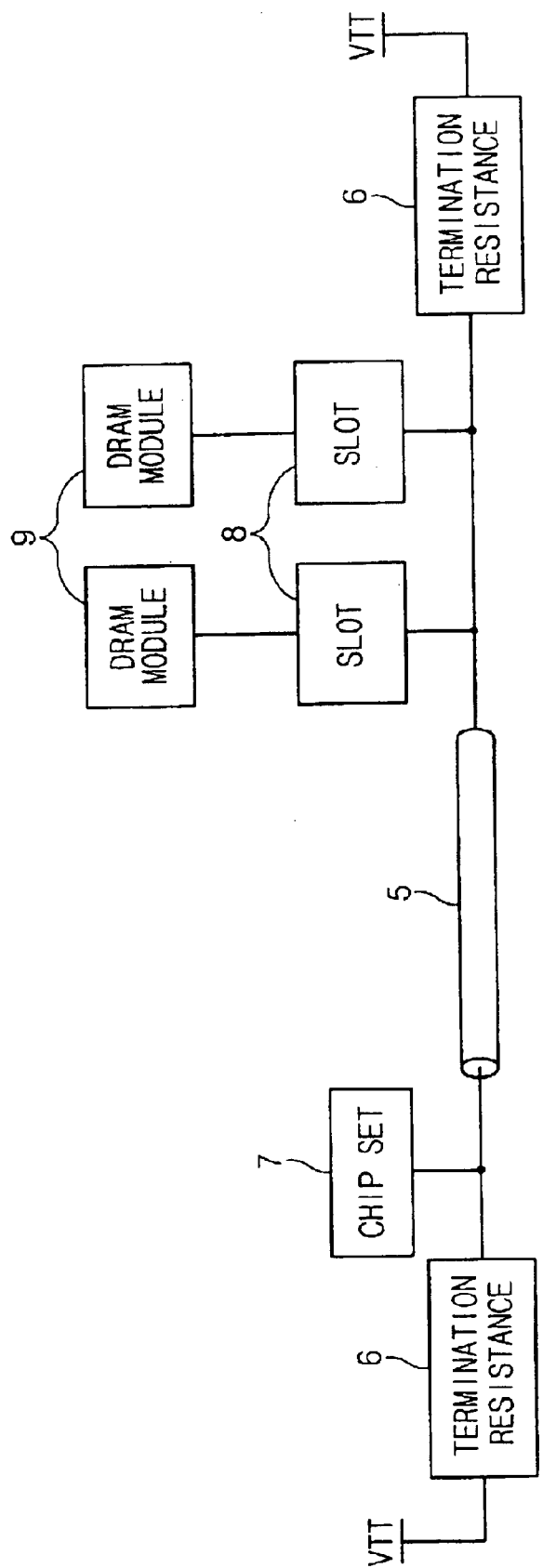
FIG. 2 is a block diagram illustrating a conventional mother board providing an SSTL interface.

The present disclosure will be described in detail with reference to accompanying drawings, in which like reference numerals are used to identify the same or similar parts.

Figure 3:
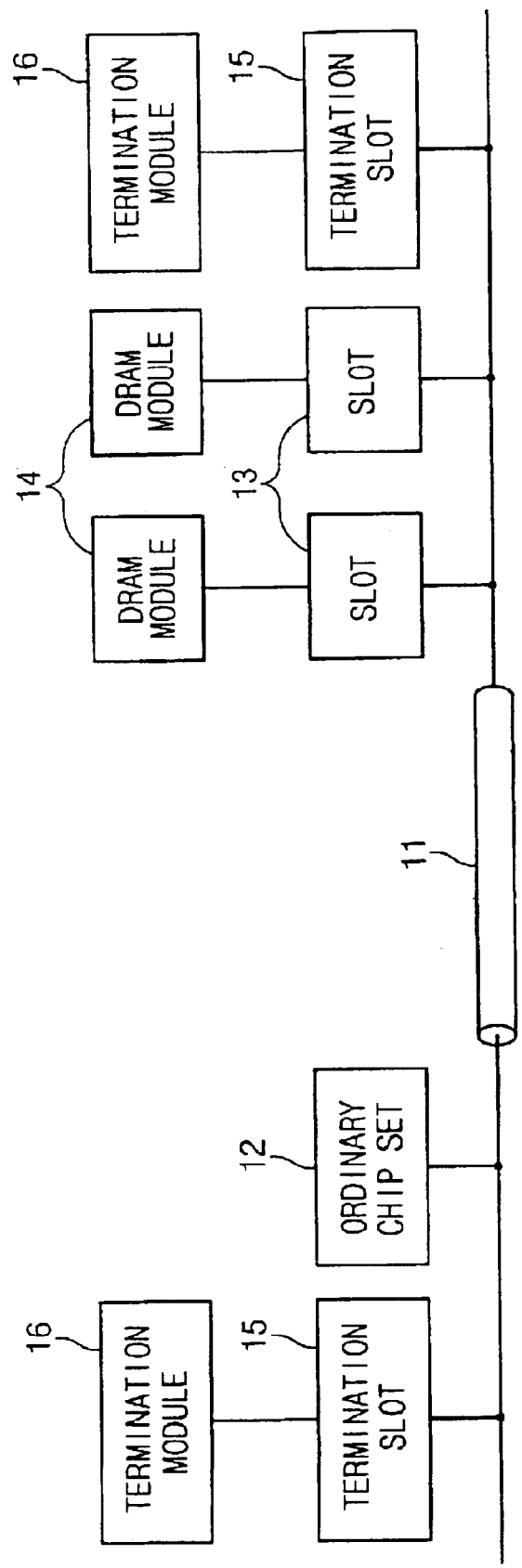
FIG. 3 is a block diagram illustrating a mother board configured to provide an ordinary interface.

FIG. 3 is a block diagram illustrating a mother board configured to provide an ordinary interface. The circuit board comprises a bus 11 having one end connected to an ordinary chip set 12 and the other end connected to a plurality of memory slots 13. DRAM modules 14 can be inserted into the plurality of the memory slots 13. In addition, both ends of the bus 11 are connected to termination slots 15. Termination modules 16, which is configured to modulate circuits by applying a termination resistance and a termination voltage, can be inserted into the termination slots 15. Here, the ordinary chip set 12 including chip sets for both LVTTL and SSTL provides either an LVTTL interface or an SSTL interface according to the condition of the terminal voltage. When the termination modules 16 are inserted into the termination slots 15, the ordinary chip set 12 operates as a chip set for SSTL. Accordingly, the mother board is set to provide an SSTL interface.

On the other hand, when the termination modules 16 are not inserted into the termination slots 15 and the termination slots 15 are unoccupied, the ordinary chip set 12 operates as a chip set for LVTTL. Accordingly, the mother board is set to provide an LVTTL interface.

Figure 4:
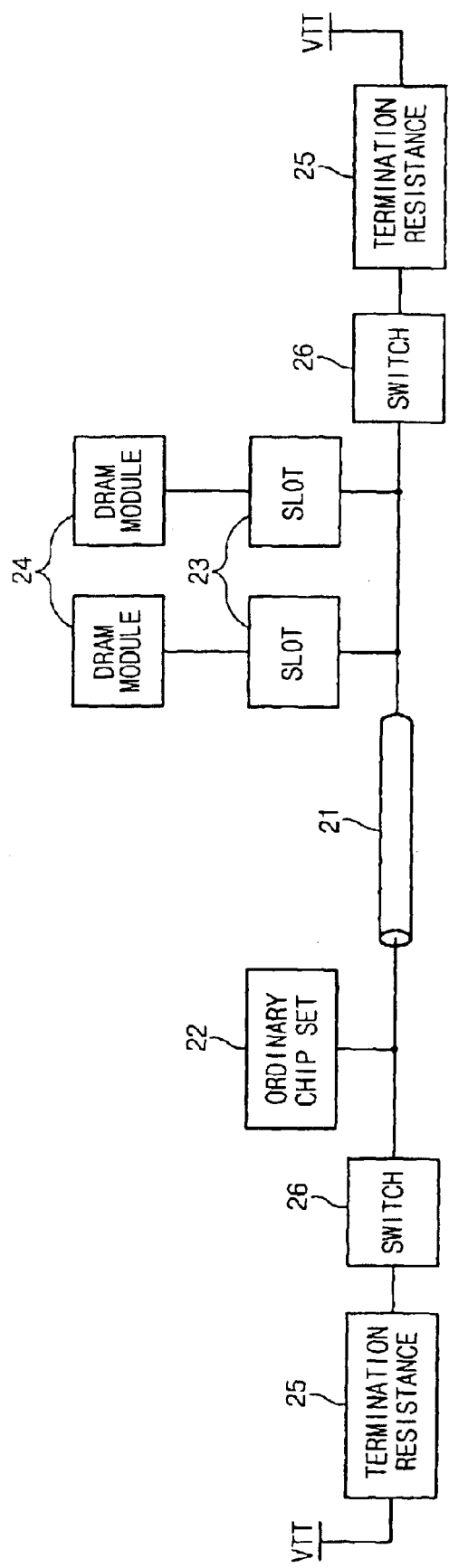
FIG. 4 is a block diagram illustrating a mother board configured to provide another ordinary interface.

Alternatively, a board may be formed comprising the bus 11 configured to apply a termination voltage VTT by inserting the termination modules 16 into the existing memory slots 13 without separately forming the termination slots 15. Referring to FIG. 4, a mother board for providing multiple interfaces comprises a bus 21 having one end connected to an ordinary chip set 22 and the other end connected to a plurality of memory slots 23. DRAM modules 24 can be inserted into the plurality of memory slots 23. Additionally, both ends of the bus 21 are connected to termination resistances 25 configured to apply a termination voltage VTT. Here, the ordinary chip set 22 including chip sets for LVTTL and SSTL provides either an LVTTL interface or an SSTL interface according to the condition of the terminal voltage VTT.

Each of the termination resistances 25 is selectively connected to the bus 21 by a switch 26. In an LVTTL interface, the switch 26 is turned off and the ordinary chip set 22 is set to operate as an LVTTL chip set. In an SSTL interface, the switch 26 is turned on and the ordinary chip set 22 is set to operate as an SSTL chip set. As a result, the mother board ordinarily operates as an LVTTL interface or an SSTL interface because of the operation of the switch 26.

As discussed earlier, the board configured to provide multiple interfaces may be used as an LVTTL interface or an SSTL interface by comprising an ordinary chip set, a separate termination slot inserted with a termination module applying a termination resistance, and a termination voltage. In addition, the board may also provide an LVTTL interface and an SSTL interface by forming an ordinary chip set and a switch configured to selectively connect a termination resistance to a bus. As a result, when DDR SDRAM is used instead of SDRAM, it is unnecessary to substitute a mother board, which in turn, reduces cost.

Many changes and modifications to the embodiments described herein could be made. The scope of some changes is discussed above. The scope of others will become apparent from the appended claims.

What is claimed is:

1. A circuit board configured to provide multiple interfaces comprising:
   a bus configured to transmit data;
   a chip set connected to one end of the bus, the chip set being configured to change setting of a memory driven system according to logic;
   a plurality of memory slots connected to the other end of the bus, each of the plurality of memory slots being configured to receive a memory module; and
   a plurality of termination slots correspondingly connected to each end of the bus and inserted with a termination module applying a termination voltage.

2. The circuit board according to claim 1, wherein the termination module comprises a termination resistance and a circuit configured to apply the termination voltage.

3. The circuit board according to claim 1, wherein each of the plurality of termination slots includes a removable termination module.

4. The circuit board according to claim 1 is configured to operate as a series stub terminated transceiver logic (SSTL) interface when the termination module is inserted into each of the plurality of termination slots, and to operate as a low voltage transistor logic (LVTTL) interface when the termination module is not inserted into each of the plurality of termination slots.

5. A circuit board configured to provide multiple interfaces comprising:
   a bus configured to transmit data;
   an ordinary chip set connected to one end of the bus, the ordinary chip set being configured to change setting of a memory driven system according to a logic;
   a plurality of memory slots connected to the other end of the bus, each of the plurality of memory slots being configured to receive a memory module;
   a plurality of termination resistances correspondingly connected to each end of the bus, each of the plurality of termination resistance being configured to apply a termination voltage; and
   a plurality of switching circuits connected between the bus and the plurality of resistances, each of the plurality of switching circuits being configured to selectively connect the bus and one of the plurality of termination resistances according to the logic.

6. The circuit board according to claim 5, wherein each of the plurality of switching circuits is configured to turn off when a current logic is LVTTL and to turn on when the current logic is SSTL.

* * * * *